United States Patent [19]

Perkins

[11] Patent Number: 5,490,042
[45] Date of Patent: Feb. 6, 1996

[54] PROGRAMMABLE SILICON CIRCUIT BOARD

[75] Inventor: Cornelius C. Perkins, Birmingham, Mich.

[73] Assignee: Environmental Research Institute of Michigan, Ann Arbor, Mich.

[21] Appl. No.: 926,296

[22] Filed: Aug. 10, 1992

[51] Int. Cl.$^6$ .................................................. H05K 1/18
[52] U.S. Cl. .................... 361/778; 361/760; 361/779; 361/794; 174/261; 257/209; 257/530
[58] Field of Search ..................................... 361/760, 761, 361/765, 767, 777, 778, 779, 774, 792–794; 174/261, 262; 257/209, 529–530

[56] References Cited

U.S. PATENT DOCUMENTS

| | | | |
|---|---|---|---|
| 3,898,603 | 8/1975 | Cricchi et al. | 174/68.5 |
| 4,458,297 | 7/1984 | Stopper et al. | |
| 4,673,966 | 6/1987 | Shimoyama | |
| 4,758,745 | 7/1988 | ElGamal et al. | |
| 4,764,644 | 8/1988 | Reisman et al. | 361/777 |
| 4,866,508 | 9/1989 | Eichelberger | |
| 5,371,390 | 12/1994 | Mohsen | 257/209 |

OTHER PUBLICATIONS

R. R. Johnson, *IEEE Spectrum*, Mar. 1990; "Multi–Chip modules next–generation packages", pp. 34–36, 46, 48.
G. Garry, *Electronic Buyers News*, Jan. 13, 1992; "A Faster Way To Prototype", p. 2.
B. C. Cole, *Electronic World News*, Jan. 20, 1992; "Aptix gives connections a program", pp. 16–17.

*Primary Examiner*—Bot L. Ledynh
*Attorney, Agent, or Firm*—Gifford, Krass, Groh, Sprinkle, Patmore, Anderson & Citkowski

[57] ABSTRACT

A signal line network on a substrate for interconnecting IC chips is programmable after manufacture to define the desired connections. The signal lines comprise line segments arranged end-to-end in both horizontal and vertical directions and are connectible at their ends and the vertical and horizontal segments are connectible at their crossings. A dedicated contact pad is connected to each segment. A plurality of bonding pads are adjacent several segments and each pad has arms extending across the several segments and are individually connectible to them. All connectible junctions comprise amorphous silicon antifuses which are normally insulators and are selectively programmable after the substrate is manufactured by applying a voltage pulse across the antifuse to render it conductive. The pads are arranged in a pattern in cells, all cells having the same pad pattern to facilitate probe connections for programming and testing.

23 Claims, 10 Drawing Sheets

|  | NORTH CONNECTIONS | | | | | | | |
|---|---|---|---|---|---|---|---|---|
| | AA | AB | AC | AD | AE | AF | AG | AH |
| | BA | BB | BC | BD | BE | BF | BG | BH |
| W | CA | CB | CC | CD | CE | CF | CG | CH |
| E | DA | DB | DC | DD | DE | DF | DG | DH |
| S | EA | EB | EC | ED | EE | EF | EG | EH |
| T | FA | FB | FC | FD | FE | FF | FG | FH |
| | GA | GB | GC | GD | GE | GF | GG | GH |
| | HA | HB | HC | HD | HE | HF | HG | HH |
|  | SOUTH CONNECTIONS | | | | | | | |

PROGRAMMABLE SILICON CIRCUIT BOARD

FIELD OF THE INVENTION

This invention relates to a programmable silicon circuit board and particularly to a general purpose circuit board capable of interconnecting a plurality of integrated circuits.

BACKGROUND OF THE INVENTION

To permit high density packaging of integrated circuits it is known to utilize a silicon substrate with bonding pads for connection to signal or power lines of the ICs and a network of conductors for making desired connections between the bonding pads. Custom circuit boards specifically designed for a given application can effectively meet the needs for such IC interconnection but are limited by economic considerations to large scale applications. The U.S. Pat. No. 4,866,508 to Eichelberger et al is an example of such a custom board. Standard horizontal conductor lines formed on the substrate comprise short line segments which are connectible together by links or to vertical lines through vias. The links and vertical lines are formed on a custom metallization layer. In the case where a relatively small production volume is planned, a preferred approach is to use a circuit board which is programmable after manufacture for a configuration which meets the circuit needs of the ICs.

Designing a programmable circuit board for general purpose use provides the challenge of placing bonding pads at locations which can be conveniently utilized by the IC connections and yet does not waste space. Because the die size of the ICs is not known in advance, the bonding pad layout must then be configured to allow wide flexibility of pad choice. Once a pad choice has been made for a given IC application, it is important that the pads be free from defects so that the choice is not compromised. While it is possible to substitute a neighboring good pad for a defective pad and adjust the circuit accordingly, that practice is not desirable since a constant pad configuration for a given product is preferred for testing the circuit after programming. That is, some test procedures for circuit boards rely on certifying that bonding pads at given locations are connected in the circuit to yield certain prescribed characteristics. It is thus desired to build a circuit board where every pad has a high probability of being good.

Examples of programmable interconnect architecture are already known. For example the U.S. Pat. No. 4,758,745 discloses a matrix of logic modules formed in a silicon substrate and interconnected by rows of horizontal and vertical connections lines. Each such line is made up of short line segments connected end-to-end by transistors and by programmable elements which comprise normally insulating material at each line junction which becomes conductive when a certain voltage is applied across the respective lines. Connections are programmable at line crossings due to a programmable element at each intersection. To apply programming voltage across the lines all the transistors in the respective lines must be conductive. An array of control lines is provided for transistor control. The requirement of the many transistors and their control lines limits the density of the connection lines and increases the probability of defective parts. Since the logic modules are built in, there is no concern for the efficient mating of bonding pads with IC dice placed on the substrate.

The U.S. Pat. No. 4,458,297 to Stopper et al entitled "Universal Interconnection Substrate", which is incorporated herein by reference, discloses a wafer-based substrate for connecting IC chips including two layers of patterned metal defining crossing lines selectively interconnected at line crossings by antifuses. The antifuses comprise vias through intervening insulator layers which contain amorphous silicon deposited as an insulator but programmable to a conductive state by the application of a threshold voltage across the antifuse. The signal interconnection network includes many bonding pads dispersed across the substrate and each pad connected to one pad line which extends either horizontally or vertically, and nets, each of which comprise an interconnected pair of horizontal and vertical lines connected to one pad at the edge of the substrate. Each pad line crosses each net and can be programmed to connect to any line.

Drawbacks to the Stopper et al configuration include high line capacitance, large die placement granularity, and scarcity of pads for high pinout dice. The high line capacitance is the direct consequence of long lines which may extend across the substrate and the number of such lines that are connected together. Granularity refers to the distance between pad groups within the substrate. If a die is slightly too big to fit within an array of pad groups, it must be assigned to the next larger array. A smaller distance between pad groups would waste less space. Another concern is that a given pad resource, i.e. a bonding pad and its associated line, is relatively large and thus subject to a greater probability of defects than would a small resource. The same is true of a net since it comprises two long lines connected together.

Figure 1:
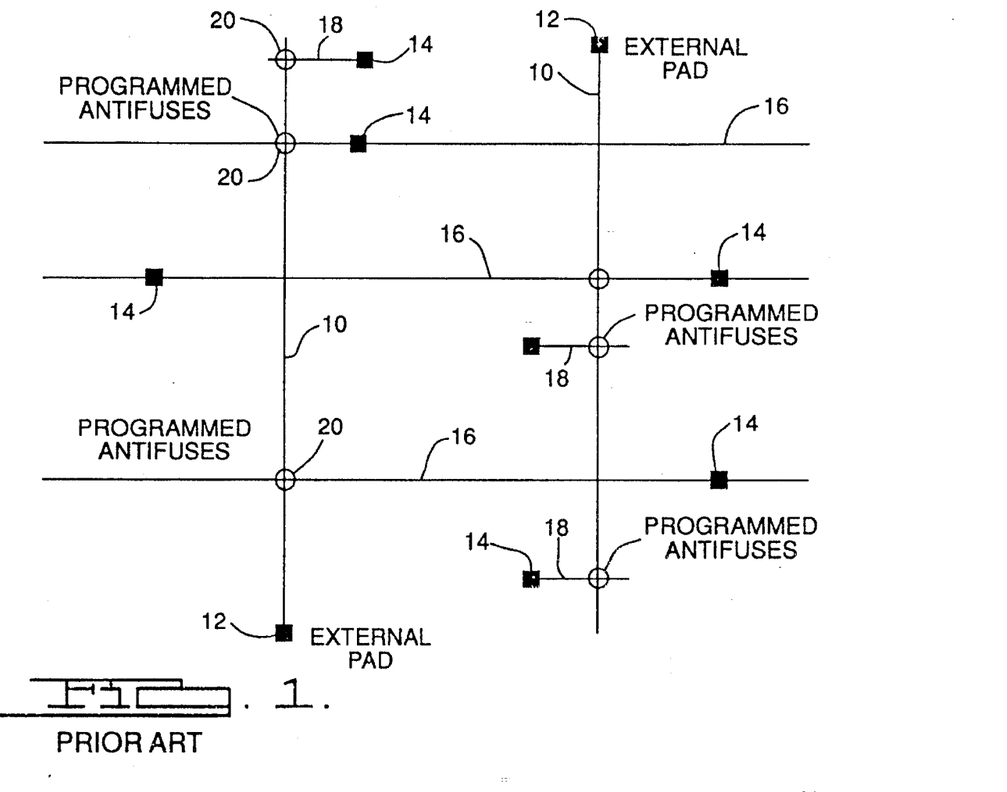
FIG. 1 is a schematic diagram showing an example of a prior art signal network design.

Later improvements to the Stopper et al approach reduced some of the problems. They used smaller substrates to limit line length and thereby reduce capacitance. As shown in FIG. 1, net lines 10 connected to external pads 12 ran only vertically except for some horizontal connecting links to side pads. Pad lines ran horizontally. Several pads 14 were connected to each pad line. One type of pad line 16 ran across the substrate from side to side and another type 18 crossed from one inside edge of a pad group to the other inside edge. The shorter lines resulted in lower capacitance. All line intersections are provided with antifuses; only the programmed antifuses 20 are shown in the drawing. Granularity was improved, giving improvement in die packing density. On the other hand, the assignment of several pads on each pad line restricts design flexibility, substrate size is limited to keep capacitance low, defect avoidance often requires changes to the wire bonding, and test time is long. Testing requires multiple setups of different probe cards; tooling is unique, or nearly so, for each member of the family.

SUMMARY OF THE INVENTION

It is therefore an object of the invention to provide an interconnection substrate having a signal network made up of very small elements each having a low probability of defects connectible by programming after substrate manufacture. Another object is to provide such a substrate with a high density array of pads and each pad connectible to any of several lines.

The invention is carried out in a wafer-based interconnection substrate for providing a programmable signal line network which is capable of interconnecting a plurality of integrated circuits associated with the substrate by signal line segments disposed end-to-end on a layer of the substrate, and programmable means disposed at predetermined locations of the substrate for selectively connecting at least some of the signal line segments together after the substrate has been manufactured.

The invention is further carried out in a wafer-based interconnection substrate for providing a programmable signal line network which is capable of interconnecting a plurality of integrated circuits associated with the substrate by signal line segments disposed on a layer of the substrate, a plurality of bonding pad means on the substrate for integrated circuit connection sites, each bonding pad means neighboring several signal line segments, and programmable means disposed at predetermined locations of the substrate for selectively connecting the bonding pad means to any of the several signal line segments after the substrate has been manufactured.

BRIEF DESCRIPTION OF THE DRAWINGS

The above and other advantages of the invention will become more apparent from the following description taken in conjunction with the accompanying drawings wherein like references refer to like parts and wherein:

FIG. 6 is a diagram showing the organization of a substrate according to the invention;

DESCRIPTION OF THE INVENTION

Figure 2:
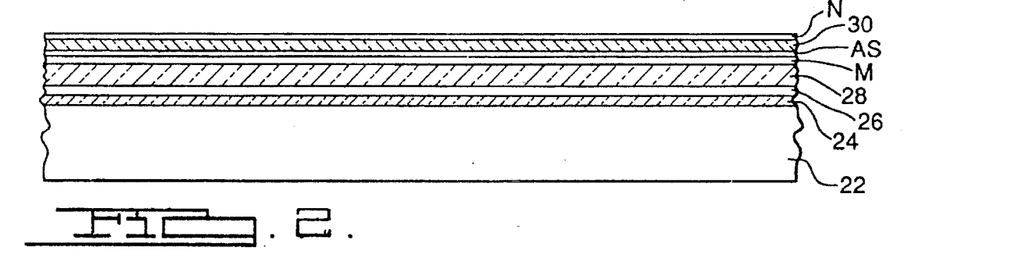
FIG. 2 is a cross section of a substrate according to the invention shown in the order of layers formed.

The interconnection substrate according to the invention is based on a silicon wafer having layers of insulator and conductor materials and structured with conductive paths between selected points on a given layer or between different layers using fabrication techniques which are well known in the art. FIG. 2 illustrates the layers of material which are required to produce the substrate in its preferred form. The wafer 22 is silicon doped to be conductive and serves as the voltage plane for the device. It is covered by a thin insulator layer 24 which, in turn, is covered by a metallization layer 26 which is used as the ground plane. Ground pads and voltage pads on the substrate are connected to these layers. A thick insulator layer 28 on the layer 26 separates the power planes from the signal network. The first metallization layer M of the signal network is formed on the insulator layer 28 and is covered by an amorphous silicon layer AS which is deposited in an insulator state. Another insulator layer 30 is applied over the AS layer and the second metallization layer N is on top. A covering insulating layer may also be added.

In contrast to prior devices which use relatively large and sometimes complex elements which are interconnected, this substrate comprises a large number of very small elements or building blocks which are interconnected. In this way, the chance of an element being defective is smaller (being proportional to the size of the element) and the interconnection choices are large. Some of the basic elements are described first.

Figure 3:
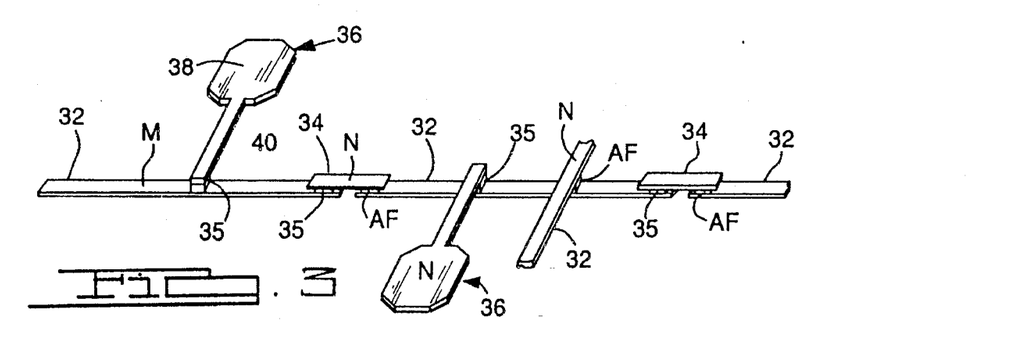
FIG. 3 is an isometric view of s section of a signal network according to the invention.

Line Segments and Contact Pads. The signal lines are made up of short line segments or links, some extending substantially horizontally and other extending substantially vertically. As will be seen, the lines may be wavy in order to weave paths around pads. FIG. 3 shows the concept of the line segment structure. A plurality of separate short segments or links 32 are formed end-to-end so that many segments can be combined to reach across the substrate. The segments 32 in one layer (M) are programmably connectible by bridges 34 in the other layer (N). One end of a bridge is connected to an end of a segment 32 by a permanent via 35 and the other end is connectible to the adjacent end of a neighbor segment by an antifuse AF. The drawing also shows a segment 32 in the N layer crossing a segment 32 in the M layer and separated by an antifuse AF. Thus by rendering selected antifuses conductive the line segments are connected endwise to neighbor segments or connected to any crossing segment. Thus where line segments or other conductors cross in different planes an antifuse AF between the planes comprises a programmable connection means, but where the conductors are in the same plane such as the segments 32, a bridge and an antifuse together comprise a programmable connection means. Because the segments are short, the number of connecting resources are proportional to the area of the substrate, and the substrate size is not restricted by a limited availability of the links and their connecting elements. For the purpose of programming the antifuses, every line segment 32 has a single dedicated contact pad 36 or dedicated pad means permanently connected to it. The pad 36 is formed in the layer opposite the associated segment and has a contact portion 38 laterally displaced from the line and an arm 40 reaching to the segment and connected to the segment by a permanent via 35. While the contact pads are essential for programming the antifuses, they may also be used as wire bonding pads and are essentially the same size as the bonding pads, described below.

Antifuses. Amorphous silicon in the layer AS is deposited as an insulator but has the property of becoming permanently conductive when a threshold voltage is applied across it. Thus when the antifuse AF material AS is located between two conductors the necessary programming voltage is applied to those conductors to make a conductive connection between them. Typically the programming voltage threshold is on the order of 20 to 40 volts, depending on the thickness of the material AS so that normal signal voltages are not sufficient to accidently fire an antifuse. An antifuse junction has a resistance of about 2 to 4 ohms.

Figure 4:
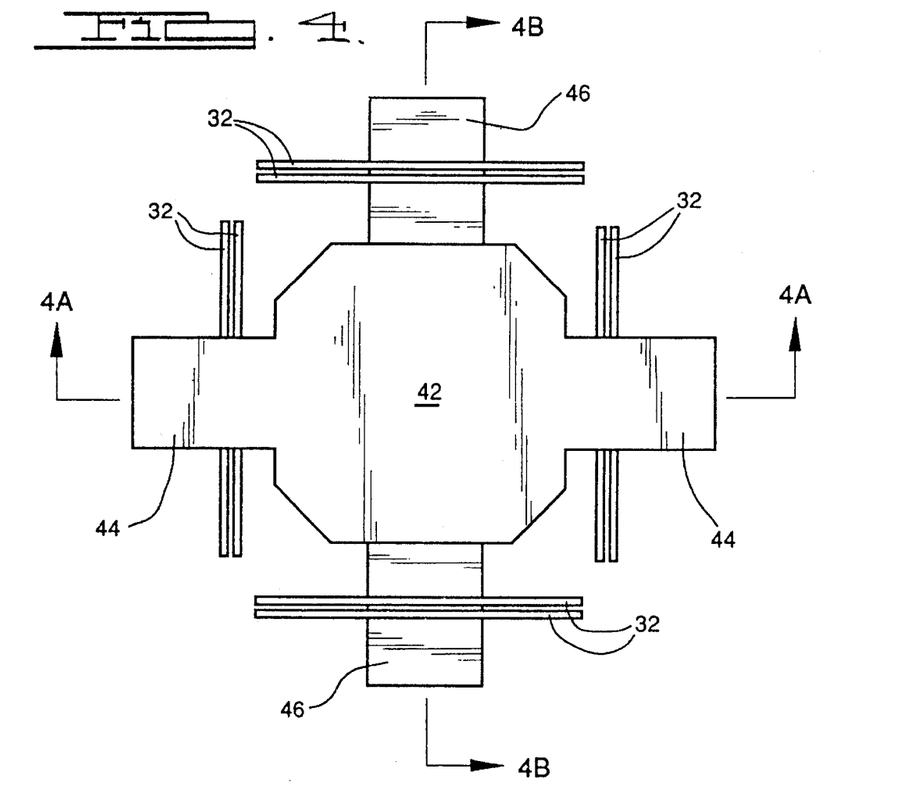
FIG. 4 is a plan view of a bonding pad and associated signal line segments according to the invention.
Figure 4A:
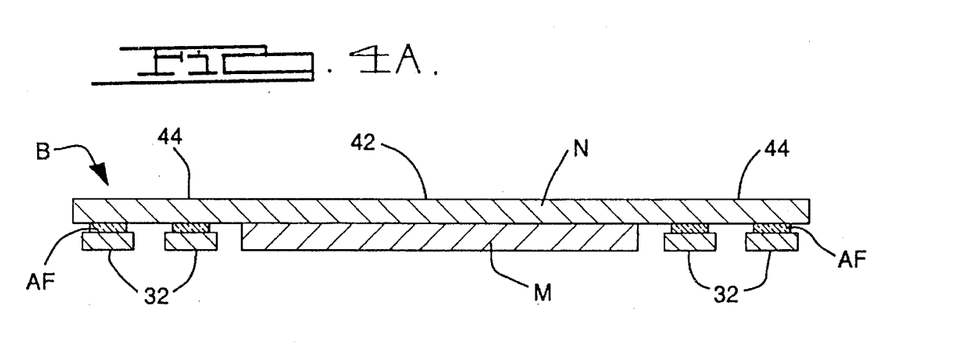
FIGS. 4A and 4B are cross sections of a bonding pad taken along lines 4A—4A and 4B—4B, respectively, of FIG. 4.
Figure 4B:
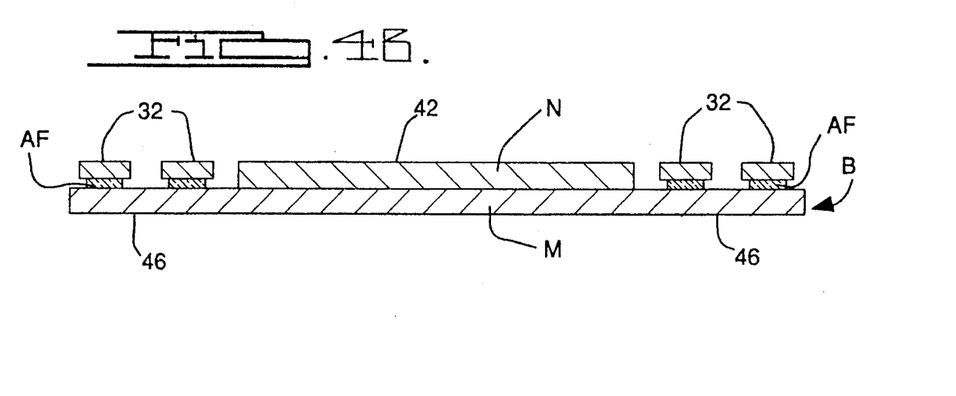

Bonding Pads. Bonding pads, also called bonding pad means or programmable pad means, provide sites for wire bonding connections to associated IC chips. In order to provide design flexibility and alternative signal paths in case of a defective connection resource, each bonding pad is formed without any connection to a signal line but has programmable antifuse connections to several line segments in each layer M and N. FIGS. 4, 4A and 4B show the bonding pad B and associated line segments 32. The pad B has a central bonding area 42 which is formed in both M and N layers. A pair of opposite outstretched arms or links 44 in the N layer extend over several M layer line segments 32 and a pair of opposite outstretched arms or links 46 in the M layer extend over several N layer line segments 32. Each crossing of an arm 44, 46 and a segment 32 is provided with an antifuse AF so that the arm and the antifuse together comprise a programmable link means. The contact area of each pad is for example 80 µm wide and each arm 44 or 46 is also about 80 µm long, sufficient to bridge three line segments spaced on 25 µm centers.

Figure 5:
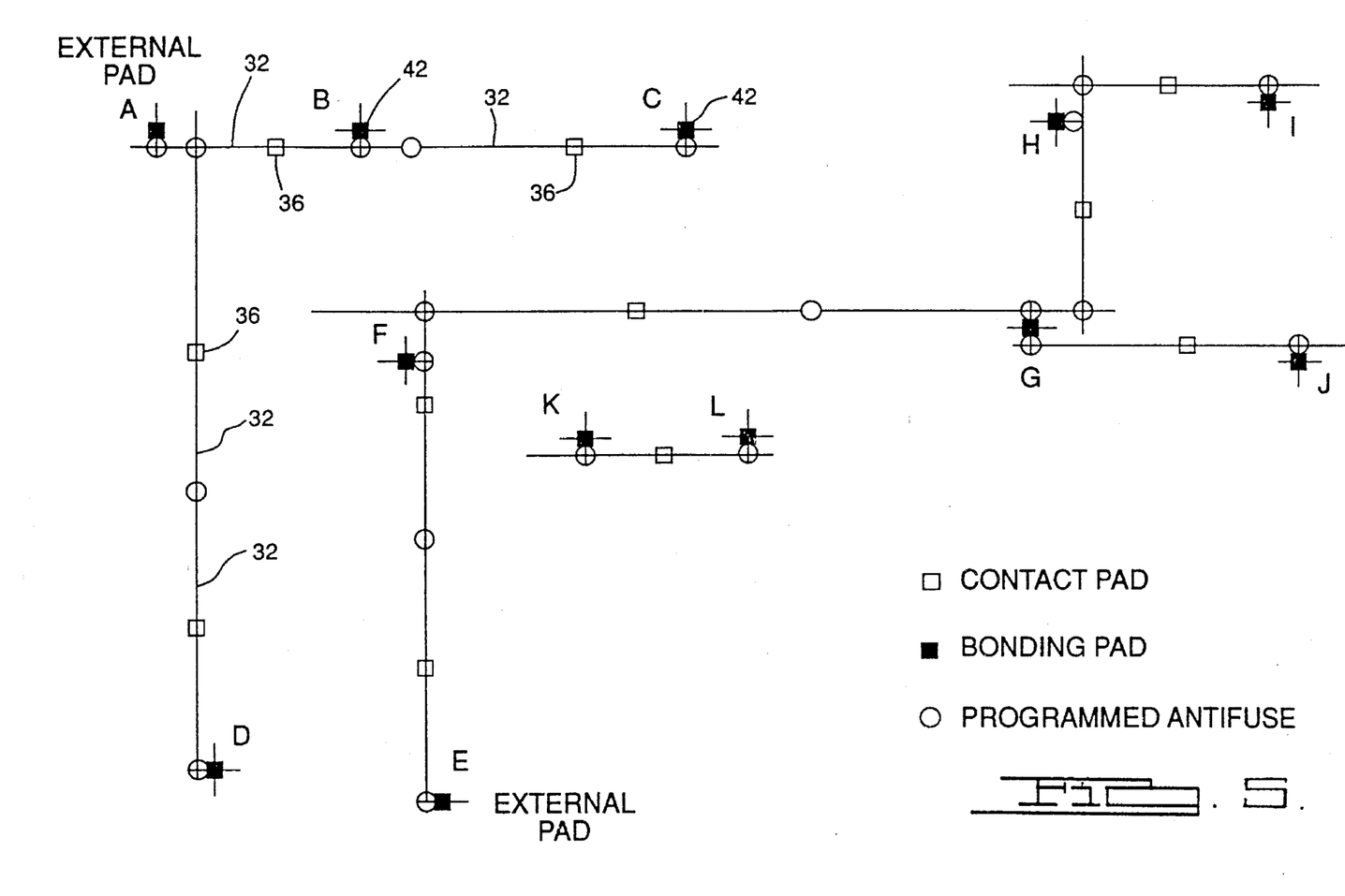
FIG. 5 is a schematic diagram showing examples of signal network design according to the invention.

FIG. 5 shows diagrammatically a hypothetical portion of a substrate with all unused resources omitted to illustrate the flexibility of combining the basic building blocks to form signal networks. Bonding pads are here identified by letters A–L. In a first network, external pad A and pad B are connected by antifuses to the same horizontal segment 32. That segment is joined endwise to another horizontal segment which is coupled to pad C. Two vertical segments are connected at their ends and are also connected to pad D and to a horizontal segment near pad A. In a second network external pad E and pads F–J are connected by several segments. Note that pad G is connected to two different horizontal lines, and that branching occurs to support pads I and J in parallel lines. The third network employs only a single segment interconnecting two pads K and L. Thus the networks may be simple or complex, short or long, without long unused lines which increase capacitance. External pads may be included or the network may be wholly internal. Also if any of the segments proved to have a defect, it could easily be bypassed.

The organization of a complete substrate is shown in FIG. 6 using an 8×8 cell format as an example. The 64 cells in the array are identified by letters AA, AB, etc, and are sites where die are mounted and wirebonded to pads on the substrate. Pads arranged along the four edges, north, east, etc, provide pads for external connections. Each cell in the pattern is detailed below, with the boundary of a cell passing through the center of the outside pads. The outside pads are shared with the adjacent cells. Each cell width is 1680 µm.

Figure 7:
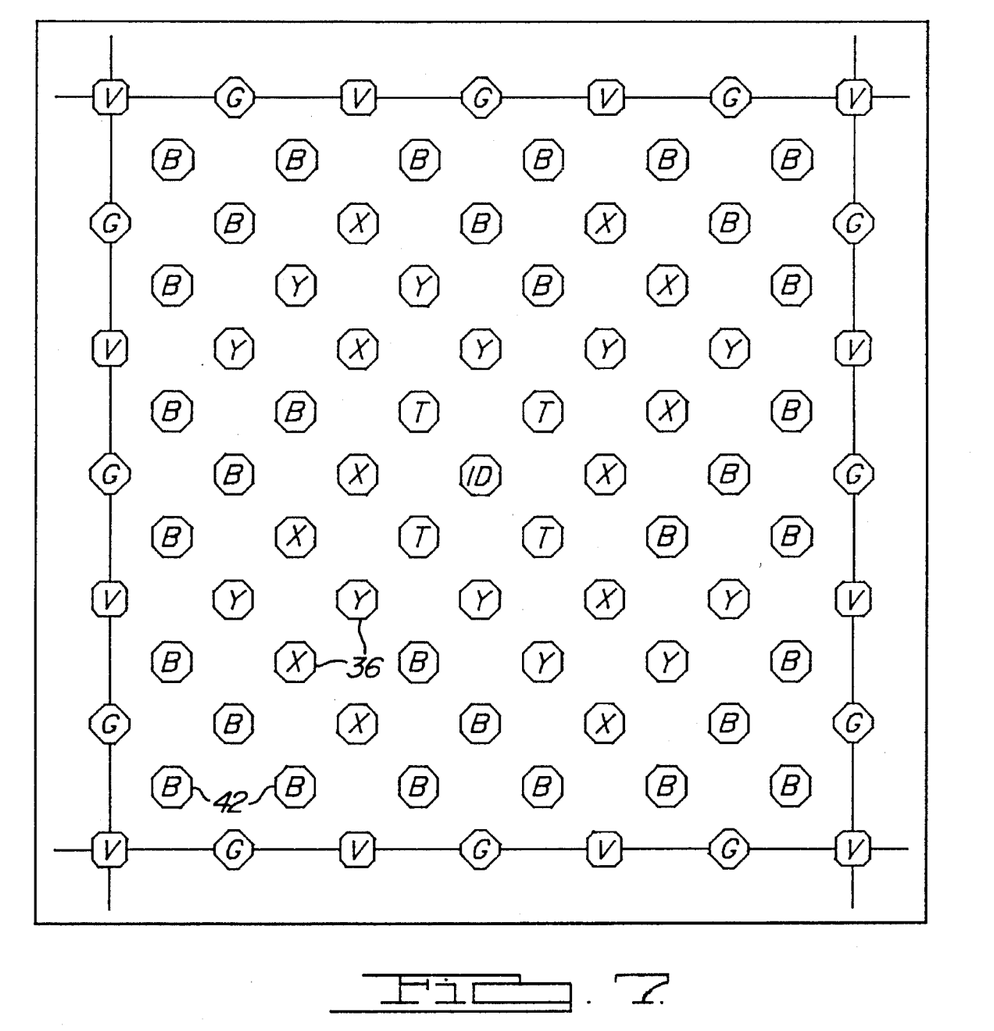
FIG. 7 is a diagram of the pad pattern of a single cell of the substrate according to the invention.

FIG. 7 illustrates the pad pattern of a cell, all the cells having the same pad pattern. The cell boundary is here indicated by horizontal and vertical lines passing through the outside cells labelled V and G for voltage pads and ground pads respectively. To distinguish each cell, its identification is printed in the center and is observable by a low power microscope. Bonding pads B fully occupy the first rows and columns inside the boundary and half of the second rank of rows and columns from the boundary. The pads marked X are the contact pads 36 connected to the horizontal segments 32 or X links and the pads marked Y are the contact pads 36 connected to the vertical line segments or Y links. T represents tie pads which are horizontally directly and permanently connected to the nearest T pad. The cell includes 36 bonding pads B, 12 contact pads X, and 12 contact pads Y, thereby offering 60 wire bonding sites spaced 280 µm in horizontal or vertical directions.

Figure 8:
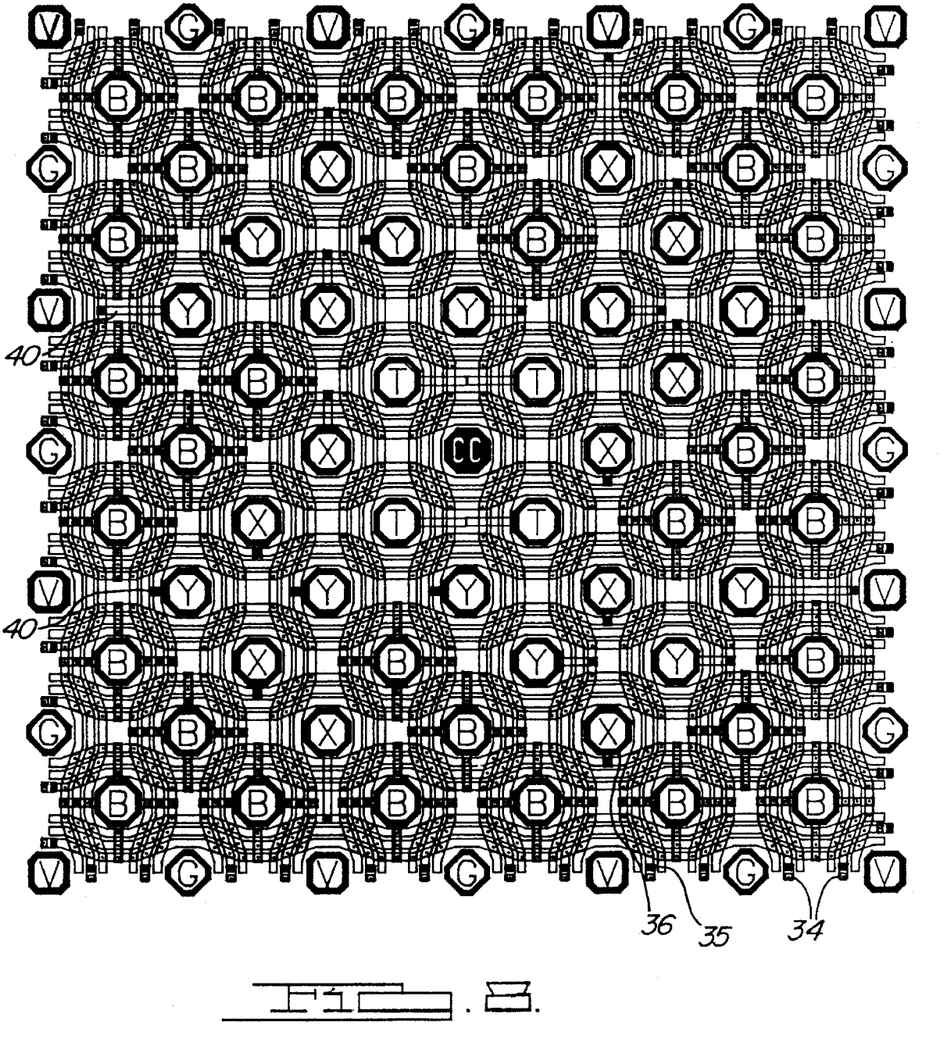
FIG. 8 is a diagram of the pad and signal network of a single cell according to the invention.
Figure 9:
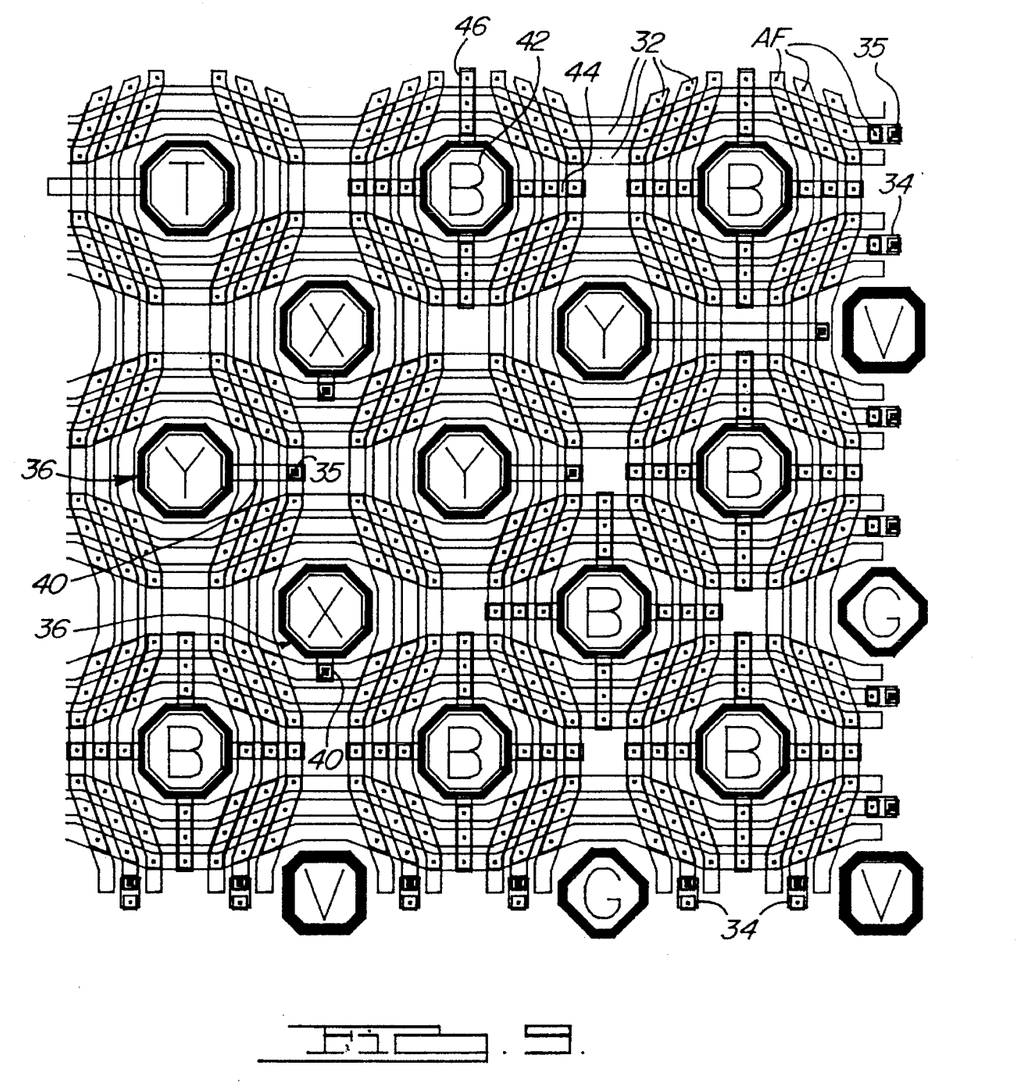
FIG. 9 is an enlarged view of a portion of the cell of FIG. 8.

FIG. 8 shows the typical cell including all the signal lines and connections to the various pads and FIG. 9 is an enlarged view of the lower right corner of FIG. 8. The X and Y lines are wavy to allow the highest pad density consistent with a given design rule for line width and spacing. If desired, straight lines can be used at a small sacrifice in pad density. Each line segment 32 is three cells long or 5040 µm, unless truncated as in the case of some line segments at the substrate edge. The segments end at cell boundaries and are staggered so that one third of the segments end at each boundary and are connected by bridges 34 to the next cell. The permanent vias 35 are shown as dark squares and antifuses AF are shown as dots. Since each segment has a contact pad 36, each cell contains one third as many contact pads as line segments. Thus there are 36 horizontal lines per cell and 12 X pads, and the same is true for vertical lines and associated pads. Some of the pads 36 have very short arms 40 to reach the closest line segment and other traverse up to five segments to reach its associated segment and thus have longer arms. Each horizontal line is connectible to each vertical line by an antifuse. The bonding pads B are connectible by each arm 44 and 46 to three vertical or horizontal lines by antifuses, so that each B pad is associated with 12 lines for potential connection. Because each B pad is so small it has a high likelihood of being good, and since it is connectible to any of several lines its availability as a bonding resource is virtually assured. This enables a predetermined bonding pad pattern to be utilized for a given application.

Figure 10:
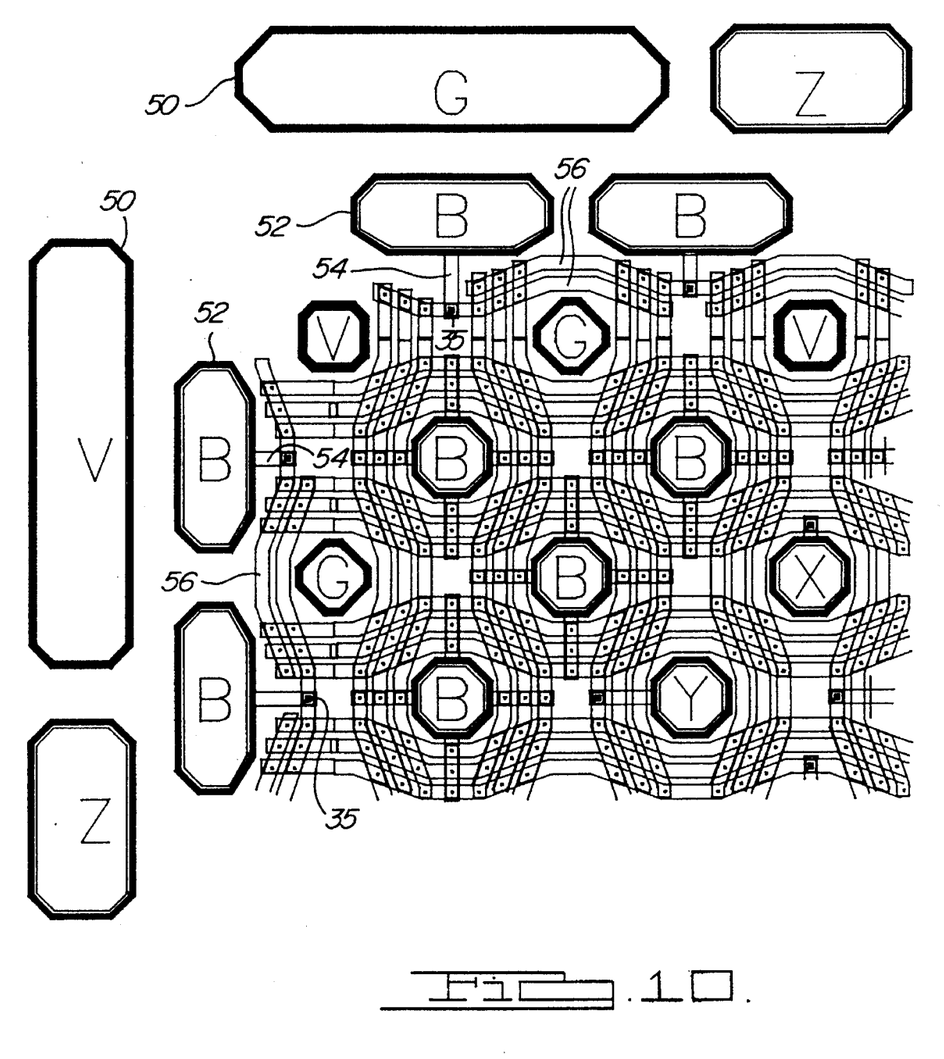
FIG. 10 is an enlarged view of a corner cell of the substrate according, to the invention.

Special substrate edge conditions are shown in FIG. 10 which includes the upper left corner of cell AA and portions of the north and west edge connections. The edge connections include the large pads 50 for voltage and ground inputs and large bonding pads 52 for signal connections. Each bonding pad 52 is connected by an arm 54 and a via 35 to a horizontal or vertical segment 56 programmably connectible to several line segments 32.

Figure 11:
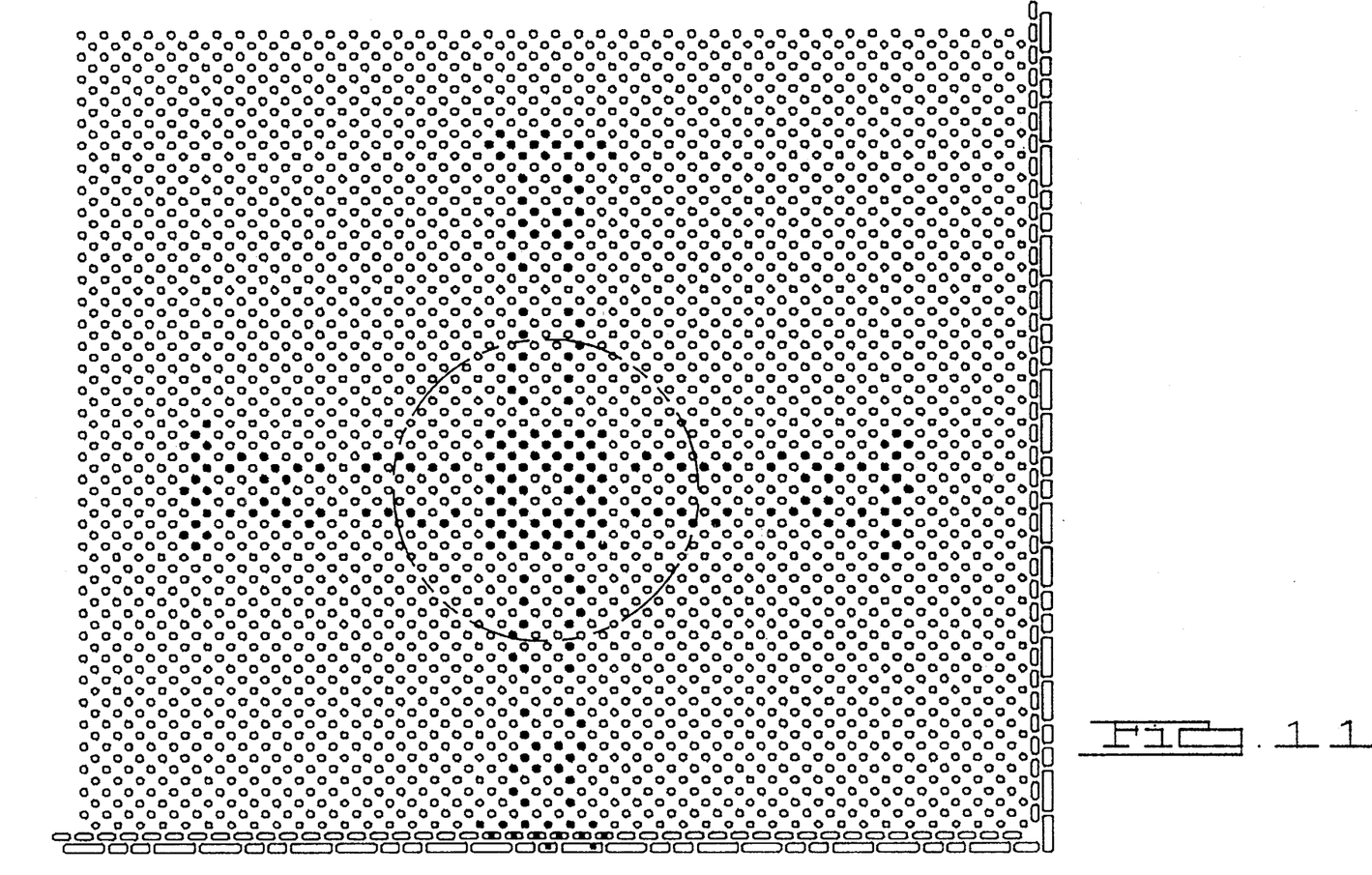
FIG. 11 is a view of the cell pattern on a portion of the substrate according to the invention with a test instrument probe pattern indicated.
Figure 12:
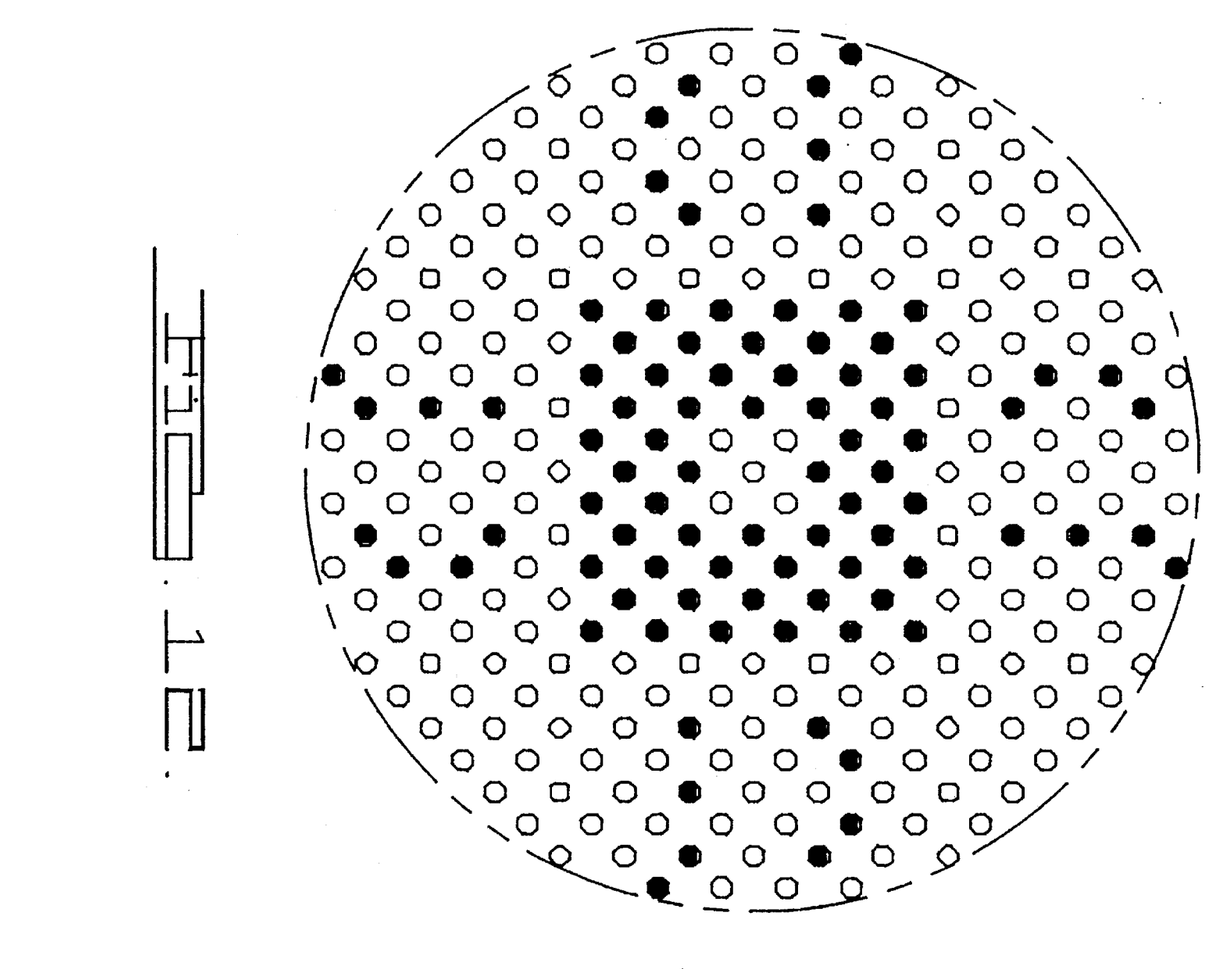
FIG. 12 is an enlarged view of the circled portion of FIG. 11.

FIG. 11 shows a large portion of a substrate spanning many cells and revealing the appearance resulting from the presence of many pads dispersed throughout the substrate. The circle surrounds a cell with its bonding and contact pads shown as black dots and which is better shown in FIG. 12. Other black dots outside the cell represent the pads necessary to be probed to test and program the cell. A universal probe card with probes in the windmill pattern shown may be constructed to simultaneously contact those pads to complete the testing or programming associated with that cell. Because the cells have the same pad pattern the probe card can be moved to any cell for the same purpose, even if some arm portions of the pattern extend beyond the substrate. The same probe card is useful for any member of the product family. Only one setup is needed to test a substrate, program it to a specific circuit, and validate the connections. The electronics driving the probes is constant, regardless of substrate size.

The embodiments of the invention in which an exclusive property or privilege is claimed are defined as follows:

1. In a wafer-based interconnection substrate for providing a programmable signal line network which is capable of interconnecting a plurality of integrated circuits associated with the substrate, signal line segments disposed end-to-end and aligned in the same direction on a layer of the substrate, and programmable connection means disposed at predetermined locations of the substrate for selectively connecting at least some of the signal line segments together after the substrate has been manufactured wherein:

the programmable connection means includes bridge means interposed between adjacent ends of the signal line segments for selectively connecting at least some of the signal line segments together; and the programmable connection means includes an antifuse material which is capable of being programmed from a high resistance state to an electrically conducting state.

2. The invention as defined in claim 1, wherein the substrate includes dedicated pad means connected to each of the signal line segments for enabling selected pairs of the signal line segments to be connected together by applying a predetermined electrical pulse across the dedicated pad means of said selected pairs of the signal line segments.

3. In a wafer-based programmable interconnection substrate for creating a programmable signal line network which is capable of interconnecting a plurality of integrated circuits associated with the substrate, first rows of first signal line segments disposed in end-to-end chains in each row on one layer of the substrate and second rows of second signal line segments disposed in end-to-end chains in each row on another layer of the substrate, programmable connection means disposed at predetermined locations of the substrate for selectively connecting at least some of the first signal line segments together, for selectively connecting at least some of the second signal line segments together, and for selectively connecting at least some of the first and second signal line segments together, the signal line connections being capable of being made after the substrate has been manufactured.

4. The invention as defined in claim 3, wherein the programmable connection means includes bridge means interposed between adjacent ends of the first signal line segments and between adjacent ends of the second signal line segments for selectively connecting at least some of the first signal line segments together and for selectively connecting at least some of the second signal line segments together.

5. The invention as defined in claim 4, wherein the programmable connection means includes an antifuse material which is capable of being programmed from a high resistance state to an electrically conductive state.

6. The invention as defined in claim 5, wherein the substrate includes dedicated pad means connected to each of the first and second signal line segments for enabling selected pairs of the first signal line segments and selected pairs of the second signal line segments to be connected together by applying a predetermined electrical pulse across the dedicated pad means of the pairs of signal line segments.

7. The invention as defined in claim 3, wherein the substrate includes a plurality of programmable pad means for enabling an electrical connection to be made between each of the programmable pad means and at least one of a plurality of the first and second signal line segments.

8. The invention as defined in claim 7, wherein each of the programmable pad means includes first programmable link means extending across a plurality of the first signal line segments for permitting an electrical connection to be made between the programmable pad means and at least one of the first signal line segments, and second programmable link means extending across a plurality of the second signal line segments for permitting an electrical connection to be made between the programmable pad means and at least one of the second signal line segments.

9. In a wafer-based interconnection substrate for providing a signal line network which is capable of interconnecting a plurality of integrated circuits associated with the substrate, the network having a plurality of signal lines, bonding pads disposed at predetermined locations along the substrate for providing specific electrical connections between integrated circuits and individual signal lines of the substrate, each of the bonding pads having programmable link means for permitting the bonding pads to be selectively connected to at least one of a plurality of the signal lines after the substrate has been manufactured, wherein the programmable link means includes a plurality of link arms extending out from each of the bonding pads to permit the bonding pads to be connected to signal lines disposed on more than one side of the bonding pads.

10. The invention as defined in claim 9, wherein the plurality of link arms permits the bonding pads to be connected to signal lines disposed on two different layers of the substrate.

11. The invention as defined in claim 10, wherein the programmable link means includes four link arms.

12. The invention as defined in claim 11, wherein the signal lines are disposed in a wavy pattern around each of the bonding pads.

13. In a wafer-based interconnection substrate for providing a programmable signal line network which is capable of interconnecting a plurality of integrated circuits associated with the substrate a plurality of bonding pad means on the substrate for integrated circuit connection sites, each bonding pad means including a pad and short outstretched arms and the signal line segments including a plurality of segments crossing each of the arms, each bonding pad means neighboring and unconnected to several line segments, and programmable connection means disposed at the crossings of the segments and the arms for selectively connecting the bonding pad means to any of the several signal line segments after the substrate has been manufactured.

14. In a wafer-based interconnection substrate for providing a programmable signal line network which is capable of interconnecting a plurality of integrated circuits associated with the substrate, signal line segments disposed on a layer of the substrate, a plurality of bonding pad means on the substrate for integrated circuit connection sites, each bonding pad means neighboring several line segments, and programmable connection means disposed at predetermined locations on the substrate for selectively connecting the bonding pad means to any of the several signal line segments after the substrate has been manufactured, wherein the substrate includes two metallization layers for carrying signals, the bonding pad means includes a pad and integral arm means in each layer, and the signal line segments include a plurality of segments in each layer crossing respective arm means in the other layer, and the programmable connection means are arranged to connect segments and arms.

15. In a wafer-based interconnection substrate for providing a programmable signal line network which is capable of interconnecting a plurality of integrated circuits associated with the substrate, signal line segments disposed on a layer of the substrate, a plurality of bonding pad means on the substrate for integrated circuit connection sites, each bonding pad means neighboring several line segments, and programmable connection means disposed at predetermined locations on the substrate for selectively connecting the bonding pad means to any of the several signal line segments after the substrate has been manufactured, wherein the substrate includes two metallization layers for carrying signals, the bonding pad means includes a pad and a pair of oppositely outstretched arms in each layer, the signal line segments in each layer include a plurality of segments extending transverse to segments of the other layer and arranged on opposite sides of the pad for selective connection to the respective arms.

16. A wafer-based interconnection substrate for providing a programmable network of signal lines capable of interconnecting a plurality of integrated circuits, comprising:

electrically conductive wafer means for providing a base which also serves as a power plane for the substrate;

first insulator layer means disposed on the wafer means for selectively isolating the wafer means;

first electrically conductive layer means disposed on the first insulator layer means for providing an additional power plane;

second insulator means disposed on the first electrically conductive layer means for selectively isolating the first electrically conductive layer means;

second electrically conductive layer means disposed on the second insulator means for providing a plurality of first signal lines;

third insulator means disposed on the second electrically conductive layer means for selectively isolating the first signal lines, the third insulator means also including a plurality of via openings at predetermined locations over the first signal lines;

third electrically conductive layer means disposed on the third insulator means for providing a plurality of second signal lines, the second signal lines being oriented relative to the first signal lines such that each of the second signal lines cross over a plurality of the first signal lines, said via openings being disposed at the signal line cross over locations; and antifuse means interposed between the first and second signal lines at predetermined cross over locations for permitting programmable connections to be made between selected ones of the first signal lines and selected ones of the second signal lines;

at least one of the second and third electrically conductive layer means also forming bonding pad areas for enabling electrical connections to be made between selected ones of the first and second signal lines and the integrated circuits, the first, second and third insulator means and the first electrically conductive layer means being formed to provide first power connection openings to the wafer means, and the second and third insulator means also being formed to provide second power connection openings to the first electrically conductive layer means.

17. A programmable silicon circuit board for interconnecting associated integrated circuits comprising:

a silicon substrate supporting a pair of spaced conductive layers and intervening insulator layers, each conductive layer formed into an array of conductors extending in a direction transverse to and crossing the conductors on the other layer;

each array of conductors including aligned line segments which in combination extend across the substrate, the aligned line segments having adjacent ends;

programmable connection means at each crossing of conductors and at the adjacent ends of the segments for forming selected segments into circuit paths; and bonding pads on the substrate for connection to associated segments.

18. The invention as defined in claim 17 wherein each bonding pad has links extending transversely to a plurality of the line segments; and further programmable connection means at each crossing of the line segments and links for selectively connecting each pad into a circuit path.

19. The invention as defined in claim 17 wherein the bonding pads each have links respectively crossing line segments on each array of conductors for selective connection between the pads and the line segments.

20. The invention as defined in claim 17 wherein a programming pad is connected to each segment to provide access for programming connection means.

21. The invention as defined in claim 20 wherein both the bonding pads and the connections pads are subject to contact by programming apparatus to complete the selective connections, and the bonding pads and the connection pads are each arranged in a pattern defining a cell in the substrate and the pattern is repeated periodically on the substrate to define a plurality of like cells, whereby the bonding pads and the programming pads are arrayed in regular locations to facilitate contact by programming apparatus.

22. The invention as defined in claim 21 wherein the cells are aligned in the directions of the conductors and each line segment extends across a maximum of three cells.

23. A programmable silicon circuit board for interconnecting associated integrated circuits comprising:

a silicon substrate supporting a pair of spaced conductive layers and intervening insulator layers, each conductive layer being formed into an array of conductors extending in a direction transverse to and crossing the conductors of the other layer;

each array of conductors including line segments aligned end-to-end to extend across the substrate, the aligned segments having adjacent ends;

a programming pad connected to each line segment;

bonding pads on the substrate having links crossing associated segments for selective connection thereto; and programmable connection means at each crossing of conductors and at adjacent ends of segments for forming selected segments into circuit paths after manufacture of the substrate.

* * * * *